(12) United States Patent
Stadlberger et al.

(10) Patent No.: US 11,499,643 B2
(45) Date of Patent: Nov. 15, 2022

(54) COATED VALVE COMPONENTS WITH CORROSION RESISTANT SLIDING SURFACES

(71) Applicant: Oerlikon Surface Solutions AG, Pfäffikon, Pfäffikon (CH)

(72) Inventors: Andreas Stadlberger, Oberriet (CH); Florian Rovere, Graz (AT); Olivier Jarry, Cologne (DE); Manfred Wurzer, Wittenbach (CH); Franz Widowitz, Feldkirch (AT)

(73) Assignee: Oerlikon Surface Solutions AG, Pfäffikon, Pfäffikon (CH)

( * ) Notice: Subject to any disclaimer, the term of this patent is extended or adjusted under 35 U.S.C. 154(b) by 249 days.

(21) Appl. No.: 16/636,519

(22) PCT Filed: Aug. 6, 2018

(86) PCT No.: PCT/EP2018/071248
§ 371 (c)(1),
(2) Date: Feb. 4, 2020

(87) PCT Pub. No.: WO2019/025627
PCT Pub. Date: Feb. 7, 2019

(65) Prior Publication Data
US 2020/0248819 A1    Aug. 6, 2020

Related U.S. Application Data

(60) Provisional application No. 62/541,184, filed on Aug. 4, 2017.

(51) Int. Cl.
*C23C 14/06* (2006.01)
*F16K 3/02* (2006.01)
(Continued)

(52) U.S. Cl.
CPC .......... *F16K 3/0263* (2013.01); *C23C 14/025* (2013.01); *C23C 14/0605* (2013.01);
(Continued)

(58) Field of Classification Search
CPC ..... F16K 3/0263; C23C 14/025; C23C 14/06; C23C 14/063; C23C 14/165; C23C 28/325; C23C 28/341; C23C 28/343
(Continued)

(56) References Cited

U.S. PATENT DOCUMENTS

| 2004/0118455 A1 | 6/2004 | Welty et al. |
| 2007/0163655 A1 | 7/2007 | Hunter |

(Continued)

FOREIGN PATENT DOCUMENTS

| CN | 101081557 A | 12/2007 |
| CN | 101424342 A | 5/2009 |

(Continued)

*Primary Examiner* — Archene A Turner

(57) ABSTRACT

A valve component comprising a substrate with a sliding surface, the sliding surface being designed to be subjected to sliding against another surface during operation of the valve, wherein at least a portion of the sliding surface is coated with a coating comprising an under-layer comprising tungsten and an upper-layer deposited atop the under-layer, said upper-layer comprising diamond-like-carbon, wherein the under-layer comprises carbon and has a layer thickness of at least 11 micrometers, and the upper-layer has a lower coefficient of friction than the under-layer and has a layer thickness of at least 1.5 micrometers.

9 Claims, 11 Drawing Sheets

(51) Int. Cl.
*C23C 14/02* (2006.01)
*C23C 14/16* (2006.01)
*C23C 28/00* (2006.01)

(52) U.S. Cl.
CPC ........ *C23C 14/0635* (2013.01); *C23C 14/165* (2013.01); *C23C 28/325* (2013.01); *C23C 28/341* (2013.01); *C23C 28/343* (2013.01)

(58) Field of Classification Search
USPC ........................................ 428/336, 408, 698
See application file for complete search history.

(56) References Cited

U.S. PATENT DOCUMENTS

| | | | | |
|---|---|---|---|---|
| 2007/0278444 | A1* | 12/2007 | Brondum | C23C 14/025 251/368 |
| 2009/0250338 | A1* | 10/2009 | Akari | C23C 14/0605 204/192.15 |
| 2010/0314005 | A1* | 12/2010 | Saito | C23C 14/024 427/249.1 |
| 2012/0205875 | A1* | 8/2012 | Kennedy | C23C 16/0281 277/442 |
| 2014/0087190 | A1* | 3/2014 | Heau | C23C 14/024 428/408 |
| 2015/0018254 | A1* | 1/2015 | Araujo | C23C 28/42 508/105 |
| 2015/0353856 | A1 | 12/2015 | Kleyman et al. | |
| 2017/0122249 | A1* | 5/2017 | Procopio | C23C 28/34 |

FOREIGN PATENT DOCUMENTS

| | | |
|---|---|---|
| CN | 101608697 A | 12/2009 |
| CN | 101823353 A | 9/2010 |
| DE | 102009028504 B3 | 1/2011 |
| EP | 2103711 A1 | 9/2009 |
| EP | 2957655 A1 | 12/2015 |
| RU | 2608454 C1 | 1/2017 |
| WO | 2013120157 A1 | 8/2013 |
| WO | 2013129939 A1 | 9/2013 |

* cited by examiner

4a

4b

4c

4d

4e

COATED VALVE COMPONENTS WITH CORROSION RESISTANT SLIDING SURFACES

The present invention relates to valve components having coated sliding surfaces, which exhibit low friction and low wear properties and high corrosion resistance and to a method for producing a valve component.

STATE OF THE ART

In the document WO 2013129939 A1 it is proposed to provide a coating with a top layer of diamond-like-carbon (DLC) on surfaces of gate valves, which are subjected to sliding during operation of the valve, in order to improve friction performance. According to this proposal the DLC coating comprises sp3 bonds or a combination of sp2 and sp3 bonds and comprises hydrogen, preferably more than 16 atom-%.

In the document US 2004118455 A1 it is proposed to apply a multilayer coating on surfaces of a gate valve, which are meant for sliding against each other, wherein the multilayer coating comprises at least a thin strengthening layer harder than the substrate material, that can be deposited directly on the substrate surface to be coated, and a thin amorphous diamond wear-resistant and friction-reducing layer deposited on the strengthening layer as top layer. Suitable materials for the strengthening layer can include compounds of Cr, Ti, W, Zr, and any other metals conventionally known for use in hard coatings. The compounds can be for example nitrides, carbides, carbo-nitrides, and other mixed-phase materials incorporating nitrogen, oxygen, and carbon. Chromium nitride is mentioned as one highly preferred material for the strengthening layer. Furthermore, conventional diamond-like-carbon (DLC) is also mentioned as another suitable material for the strengthening layer and must be distinct from the amorphous diamond material used as top layer. This document refers to amorphous diamond as a form of non-crystalline carbon, which is commonly called tetrahedrally-bonded amorphous carbon (taC) and mentions that it can be characterized as having at least 40 percent sp3 carbon bonding, a hardness of at least 45 GPa and an elastic modulus of at least 400 GPa. The strengthening layer is intended to support the top amorphous diamond layer and has a primarily function to improve scratch and abrasion resistance of the coating in comparison with only using the amorphous diamond layer. The thickness of the strengthening layer and the amorphous diamond layer are suggested to be between 500 nm and 10 microns, and between 100 nm and 2 microns, respectively.

The above-mentioned coatings according to the state of the art are suitable for attaining low friction and low wear of surfaces of gate valves exposed to sliding during operation of the valve. However, there is still the need of attaining appropriate corrosion resistance on surfaces of valve components exposed to corrosive substances.

OBJECTIVE OF THE PRESENT INVENTION

The main objective of the present invention is to provide a valve component and a method for producing a valve component having sliding surfaces to be subjected to sliding during operation of the valve, which exhibit at the same time low friction, high wear resistance in terms of erosion resistance and scratch resistance, and high corrosion resistance, when it is exposed to corrosive substances.

BRIEF DESCRIPTION OF THE DRAWINGS

FIGS. 4a, 4b, 4c, 4d, and 4e, shows pictures of a reference sample according to Example 1.

FIGS. 11a and 11b, shows pictures comparing different coating designs.

DESCRIPTION OF THE PRESENT INVENTION

Figure 1:
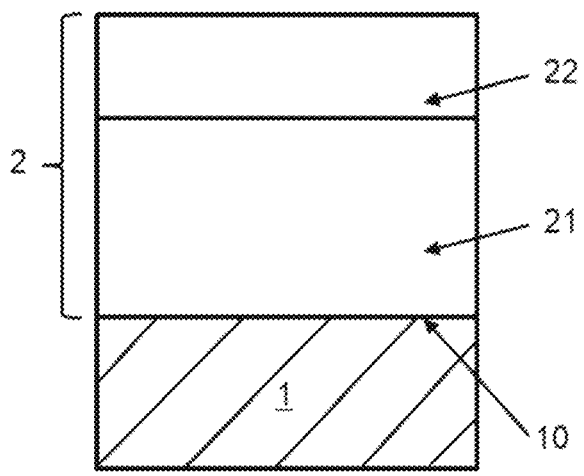
FIG. 1 shows a coating design for coating a valve component.

The objective of the present invention is attained by providing a valve component with a substrate with at least one sliding surface made of a first material. The first material is the material of the substrate. The sliding surface being designed to be subjected to sliding against another surface during operation of the valve. By sliding the sliding surface against another surface it is meant that the sliding surface can slide directly on the another surface, but also there can be one or more layers atop of the sliding surface and the layer atop of the sliding surface slides directly on the another surface. At least a portion of the sliding surface is coated with a coating comprising an under-layer comprising tungsten and an upper-layer deposited atop the first layer (i.e. atop the under-layer), said upper-layer comprising diamond like carbon (DLC), wherein the under-layer comprises carbon and has a layer thickness of at least 11 microns, and the upper-layer has a lower coefficient of friction than the under-layer and has a layer thickness of at least 1.5 micrometers.

The thicknesses of the under-layer of at least 11 micrometers is especially beneficial at least for:

Ensuring enough corrosion resistance

Ensuring enough scratch resistance

Ensuring enough abrasion resistance

The upper-layer is preferably deposited as outermost layer (also called top layer).

The upper-layer can be a hydrogen-containing DLC layer or a DLC layer without containing hydrogen, which can also be referred to as hydrogen free DLC layer.

According to a preferred embodiment of the present invention the under-layer is made of tungsten carbide or comprise tungsten carbide.

Preferably the under-layer comprises tungsten carbide. Tungsten carbide is especially beneficial for the above mentioned benefits, like ensuring enough corrosion resistance, enough scratch resistance, enough abrasion resistance.

According to a further embodiment of the present invention the under-layer comprises tungsten and carbon but not any carbide.

The under-layer functions as supporting layer and the thickness of at least 11 micrometers makes possible to attain a considerable scratch resistance.

The layer thickness of the under-layer is preferably of at least 12 micrometers. This ensures higher corrosion resistance. Preferably the under-layer has a layer thickness between 12 µm and 30 µm, still more preferably between 20 µm and 30 µm. This ensures a high scratch resistance.

This beneficial effect mentioned above was especially considerable in cases in which the under-layer was deposited comprising tungsten carbide. Therefore, the inventors recommend specially to produce the under-layer comprising tungsten carbide or being made of tungsten carbide.

By coating valve components according to the present invention, it is possible to attain sufficient low friction for allowing use of actuators with reduced size.

The present invention is exceptionally suitable for attaining low wear for long lifetime for subsea gate valves (>30 years).

Pure sputtering of targets made of tungsten carbide or targets made of tungsten carbide and nickel, wherein nickel is preferably used only as binding agent, result in very brittle coatings. Therefore the inventors preferably recommend to produce the above-mentioned tungsten carbide coatings by using not only argon, which it would be in the case of pure sputtering, but by using also carbon- and hydrogen-containing gases (e.g. acetylene, methane . . . ) during deposition of this kind of layers, e.g. during sputtering of tungsten carbide targets for improving toughness properties. Toughness properties can preferably be measured for example in HRC indenter tests and scratch tests.

For deposition of the directly above-mentioned embodiment the inventors recommend using a PVD sputtering process for depositing adhesion layer and the under-layer. A PA-CVD or PVD sputtering or ARC evaporation or HIPIMS for depositing the upper-layer is preferably used.

The objective of the present invention is attained by providing a method for producing a valve component.

Preferably a PVD sputtering process is used for depositing the under-layer and a PA-CVD or PVD sputtering or ARC evaporation or HIPIMS is used for depositing the upper-layer.

Preferably between the coating and the sliding surface a Cr layer is deposited as adhesion layer, preferably using a PVD sputtering process.

Preferably the under-layer comprises:

a first-under-layer comprising Cr and WC, wherein the first-under-layer is formed having a multilayer structure comprising:

a first sub-layer deposited on the Cr adhesion layer, a second sub-layer deposited on the first sub-layer and a third sub-layer deposited on the second sub-layer, wherein, if only Cr-content and WC-content in the first-under-layer are considered, then:

the first sub-layer is a gradient layer, exhibiting decreased average concentration of Cr and increased average concentration of WC along its thickness in direction to the outermost layer with initial average concentration of Cr of 100 at % and initial average concentration of WC of 0 at. %, the second sub-layer is a layer with constant average concentration of Cr and WC along its thickness, and the third sub-layer is a gradient layer, exhibiting decreased average concentration of Cr and increased average concentration of WC along its thickness in direction to the outermost layer with final average concentration of Cr of 0 at % and final average concentration of WC of 100 at. %, a second-under-layer deposited on the first-under-layer comprising WC+C or comprising WC+C+H, a third-under-layer deposited on the second-under-layer deposited as gradient layer, exhibiting decreased average concentration of WC along its layer thickness with final average concentration of WC of 0 at. %, and an upper layer of DLC, wherein the deposition of the Cr layer Cr-targets are sputtered in argon atmosphere, following for depositing the first sub-layer WC-targets are sputtered by increasing sputtering power continuously while sputtering power continuously increases, while sputtering power at the Cr-targets can be maintained constant, wherein for depositing the second sub-layer both the sputtering power of the Cr-targets and the WC-targets is maintained constant, wherein for depositing the third sub-layer the sputtering power at the Cr-targets is continuously reduced till disconnection of the Cr-targets and the sputtering power at the WC-targets is maintained constant or increased continuously, wherein for depositing the second-under-layer a carbon-containing gas is introduced in the coating chamber and maintained constant, for example acetylene gas, wherein for depositing the third-under-layer the sputtering power at the WC-targets is reduced continuously till disconnection of the WC-targets while the acetylene gas flow is increased as well as bias voltage is increased till attained the desired condition for depositing the DLC upper-layer.

Figure 2:
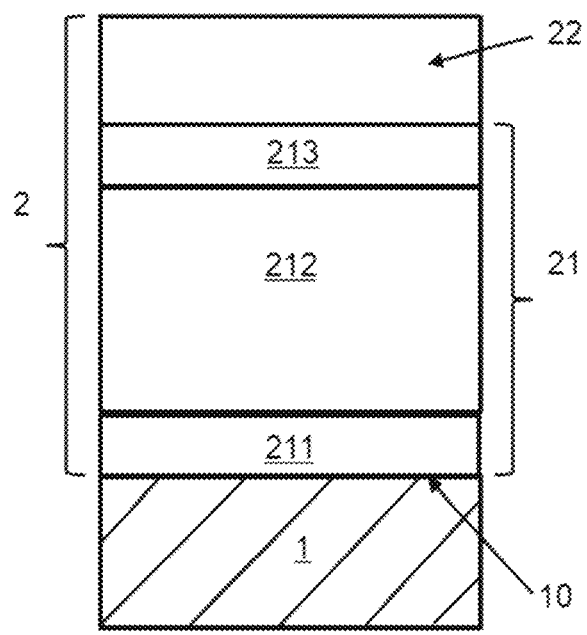
FIG. 2 shows another coating design for coating a valve component.

FIGS. 1 and 2 show drafts of the coating designs used for coating the above-mentioned coated valve components according to the present invention.

FIG. 1 shows a coating 2 coated on a substrate 1. The coating design according to the present invention comprising one under-layer 21 deposited on a surface 10 of the substrate 1, and one upper-layer 22 deposited on the under layer 21 as outermost layer (top layer). A substrate 1 can for example be a valve component or a pan of a valve e.g. a seat.

FIG. 2 shows a preferred embodiment of a coating design according to the present invention comprising an under-layer 21 and an upper-layer 22 deposited as outermost layer but in which the under layer 21 is produced comprising three layers: a first-under-layer 211, a second-under-layer 212 deposited on the first-under-layer and a third-under-layer 213 deposited on the second-under-layer, wherein the second-under-layer 212 is thicker than the first-under-layer 211. The second-under-layer 212 is thicker than the third-under-layer 213. The second-under-layer 212 is thicker than the upper-layer 22.

According to a preferred embodiment of the present invention:

the first-under-layer 211 is made of or comprises WC (tungsten carbide) or is made of or comprises W (tungsten), the second-under-layer 212 is made of or comprises WC (tungsten carbide) or is made of or comprises W (tungsten) or is made of or comprises WC-doped DLC (also referred to as a-C:H:WC or WC/C) or is made of or comprises W-doped DLC (also referred to as a-C:H:W), the third-under-layer 213 is made of or comprises WC-doped DLC or is made of or comprises W-doped DLC (a-C:H:W), and the upper-layer 22 is made of or comprises DLC.

In the context of the present invention following abbreviations will be used:

DLC: diamond-like-carbon containing hydrogen or not containing hydrogen,
W: tungsten,
C: carbon,
WC: tungsten carbide,
WC+C: amorphous carbon layer comprising tungsten carbide or tungsten carbide layer comprising additional carbon,
WC-doped DLC: DLC comprising tungsten carbide,
W-doped DLC: DLC comprising tungsten but not tungsten carbide,
HVOF: high velocity oxygen fuel spraying,
PVD: physical vapor deposition,
ARC evaporation: PVD process in which an arc current is applied to a target for operating it as cathode and generating an arc for evaporation of material from the target,
sputtering: PVD process in which sputtering power is applied to a target for operating it as cathode and accelerating positive argon ions to the surface of the target for producing pulverization of material from a target,
CVD: chemical vapor deposition,
PA-CVD or PE-CVD: plasma assisted chemical vapor deposition or plasma enhanced chemical vapor deposition, and
HiPIMS or HPPM: high-power impulse magnetron sputtering or high power pulsed magnetron sputtering.

DLC is a known abbreviation usually used for referring to diamond-like carbon, which is a class of amorphous carbon material comprising a mixture of carbon-carbon bonds with $sp^3$ and $sp^2$ hybridization or comprising essentially or exclusively carbon-carbon bonds with $sp^3$ hybridization.

As mentioned-above, the inventors found surprisingly that the thickness of the under-layer 21 plays a very decisive role for attaining satisfactory resistance against corrosion, scratch and abrasion. Therefore, the inventors suggest using preferably thickness of the under-layer 21 of at least 11 micrometers, preferably at least 12 micrometers, more preferably at least 20 micrometers, more preferably between 20 micrometers and 30 micrometers.

This beneficial effect mentioned above was especially considerable in cases in which the under-layer was deposited comprising tungsten carbide. Therefore, the inventors recommend specially to produce the under-layer 21 comprising tungsten carbide or being made of tungsten carbide.

According to a further embodiment of the present invention the upper-layer 22 is deposited being made of DLC and the under-layer 21 is deposited comprising tungsten and carbon but not comprising any carbide, in particular not comprising tungsten carbide. In such a case the under-layer can be deposited for example in following manners:
consisting of one or more layers made of W-doped DLC, or
consisting of one or more layers made of W, or
consisting of two layers, more specifically one of the two layers being deposited nearest to the substrate 1 and being made of W and the other one layer being deposited nearest to the upper-layer 22 and being made of W-doped DLC, or
consisting of two layers, more specifically one of the two layers being deposited nearest to the substrate 1 and being made of W-doped DLC and the other one layer being deposited nearest to the upper-layer and being also made of W-doped DLC, wherein each layer differing from the other one in the composition, for example the layer placed nearest to the upper-layer comprising a lower content of W than the layer deposited nearest to the substrate.

Figure 3:
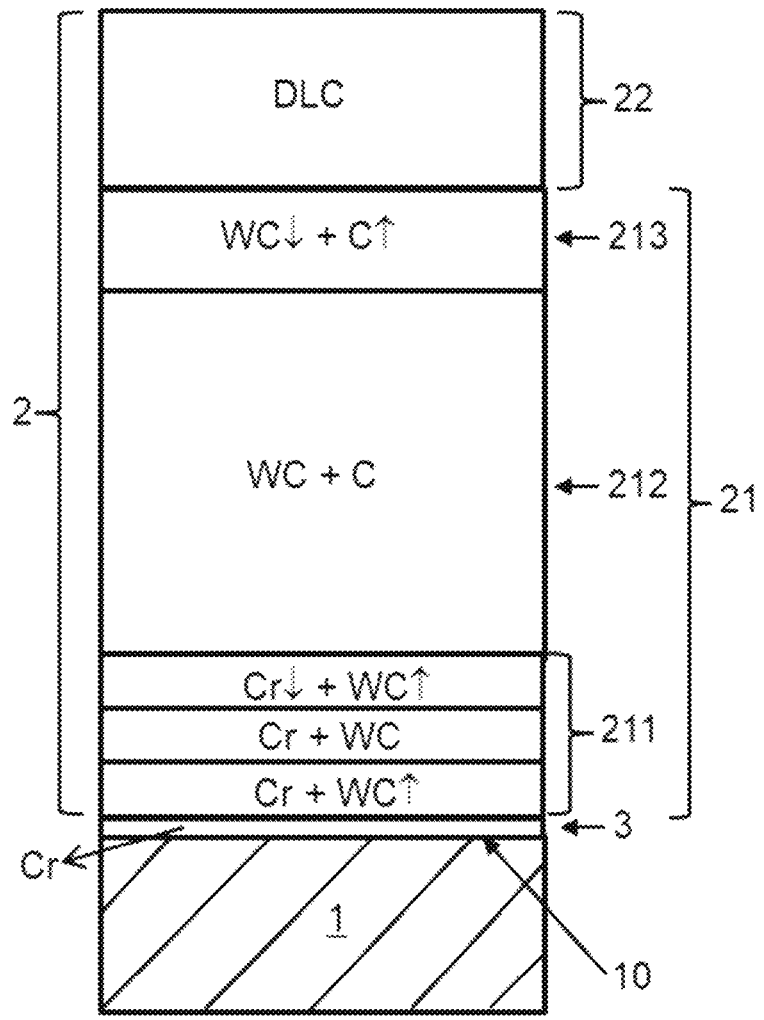
FIG. 3 shows yet another coating design for coating a valve component.

A most preferred embodiment of the present invention is shown in FIG. 3 and comprises:

a Cr layer deposited as adhesion layer 3 deposited between the substrate surface 10 of the substrate 1 and the first-under-layer 211, preferably this adhesion layer is a Cr layer having thickness between 200 nm and 600 nm, more preferably between 300 nm and 500 nm, a first-under-layer 211 comprising Cr and WC, wherein the first-under-layer 212 is formed having a multilayer structure comprising:

a first sub-layer deposited on the Cr adhesion layer 3, a second sub-layer deposited on the first sub-layer and a third sub-layer deposited on the second sub-layer, wherein, if only Cr-content and WC-content in the first-under-layer 211 are considered, then:

the first sub-layer is a gradient layer, exhibiting decreased average concentration of Cr and increased average concentration of WC along its thickness in direction to the outermost layer with initial average concentration of Cr of 100 at % and initial average concentration of WC of 0 at. %, the second sub-layer is a layer with constant average concentration of Cr and WC along its thickness, preferably exhibiting average concentration of Cr higher than 5 at. % and lower than 95 at. % and exhibiting average concentration of WC higher than 5 at. % and lower than 95 at. %, and the third sub-layer is a gradient layer, exhibiting decreased average concentration of Cr and increased average concentration of WC along its thickness in direction to the outermost layer with final average concentration of Cr of 0 at % and final average concentration of WC of 100 at. %, a second-under-layer 212 deposited on the first-under-layer 211 comprising WC+C or comprising WC+C+H, preferably having layer thickness between 11 μm and 50 μm, more preferably between 12 μm and 30 μm, still more preferably between 20 μm and 30 μm, a third-under-layer 213 deposited on the second-under-layer 211 deposited as gradient layer, exhibiting decreased average concentration of WC along its layer thickness with final average concentration of WC of 0 at. %, and an upper layer 22 of DLC, preferably having layer thickness higher than 1.5 micrometers, more preferably higher than 2 micrometers, still more preferably between 3 micrometers and 5 micrometers.

For deposition of the directly above-mentioned embodiment the inventors recommend using a PVD sputtering process for depositing adhesion layer 3 and the under-layer 21. A PA-CVD or PVD sputtering or ARC evaporation or HIPIMS for depositing the upper-layer 22 is preferably used.

For the deposition of the Cr layer Cr-targets can be sputtered in argon atmosphere. Preferably following for depositing the first sub-layer WC-targets can be sputtered by increasing sputtering power continuously while sputtering power at the Cr-targets can be maintained constant. For depositing the second sub-layer both the sputtering power of the Cr-targets and the WC-targets can be maintained constant. For depositing the third sub-layer the sputtering power at the Cr-targets can be continuously reduced till disconnection of the Cr-targets and the sputtering power at the WC-targets can be maintained constant or increased continuously. For depositing the second-under-layer 212 a carbon-containing gas can be introduced in the coating chamber and maintained constant, for example acetylene gas. For depositing the third-under-layer 213 the sputtering power at the WC-targets can be reduced continuously till disconnection of the WC-targets while the acetylene gas flow can be increased as well as bias voltage can be increased till attained the desired condition for depositing the DLC upper-layer 22.

Using a carbon-containing such as acetylene during sputtering of WC-targets results surprisingly in considerably benefits, such as:

Lower roughness, and

Lower brittleness

Figure 10:
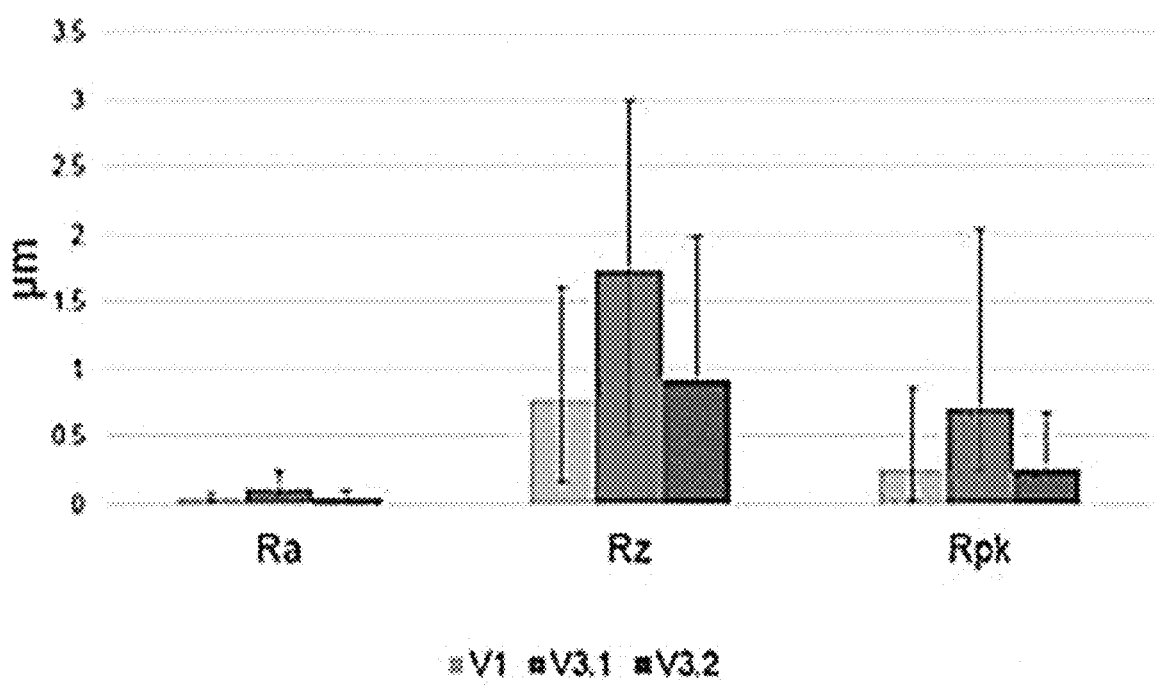
FIG. 10 is a diagram showing a comparison of roughness values of different coating designs.

FIG. 10 shows the considerably reduction of roughness values by using a carbon containing gas (e.g. acetylene) during deposition of a WC under-layer.

The diagram in FIG. 10 shows the roughness values measured by following coating designs:

V1 (not inventive): WC under-layer having layer thickness of 3.5 μm WC deposited by sputtering of WC-targets in argon atmosphere (without acetylene gas) and DLC upper-layer.

V3.1 (inventive): WC under-layer having layer thickness of 25 μm WC deposited by sputtering of WC-targets in argon atmosphere (without acetylene gas) and DLC upper-layer.

V3.2 (inventive): WC under-layer having layer thickness of 25 μm WC deposited by sputtering of WC-targets in atmosphere comprising argon and acetylene (acetylene flow of 50 sccm) and DLC upper-layer.

Figure 11:
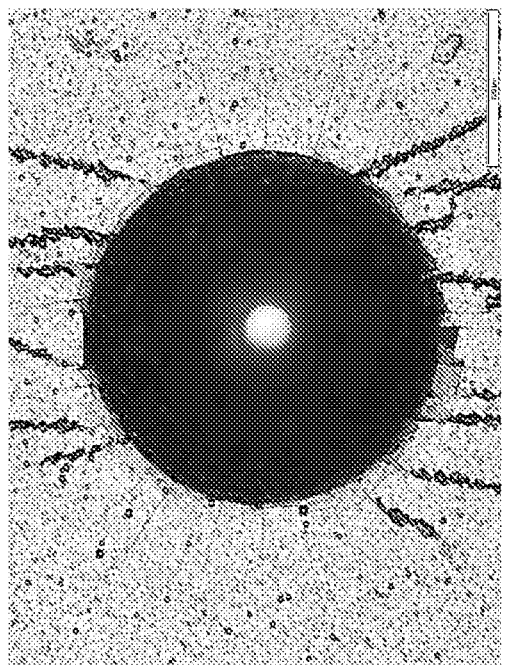
FIG. 11, including
Figure 11:
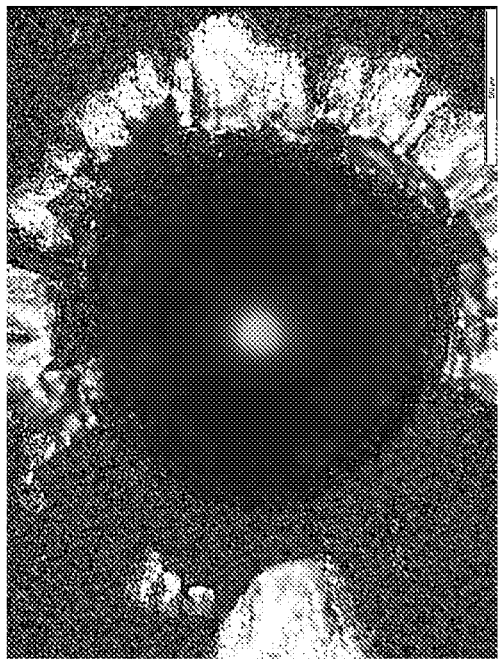

FIG. 11 shows a picture in FIG. 11a of the surface of a sample coated with the coating design V3.1 and in FIG. 11b the surface of a sample coated with the coating design V3.2, in each case after HRC Rockwell indentation. This comparison in FIG. 11 shows the considerably improvement attained by reducing brittleness by using a carbon containing gas (e.g. acetylene) during deposition of a WC under-layer according to one preferred embodiment of the present invention. In the picture shown in FIG. 11b there are no delamination but only small fissures, while in the picture shown in FIG. 11a one can observe clear delamination of the coating.

EXAMPLES OF THE PRESENT INVENTION

Usually concentrated HCl is flushed through to remove residues (like calcium carbonate) of the well and with it the tubes and the valves for accomplishing the necessary regular cleaning of this components. Therefore, a high corrosion resistance of surfaces of components exposed to this kind of treatments is desired.

For this reason, experiments for analysis of improvements attained by implementation of the present invention in relation to protection of Inconel substrates for gate valves against corrosion were carried out.

Description of the tests and results:

Test coupons made of Inconel 718 having a diameter of approx. 50 mm, so that the surface exposed to the corrosion fluid shows a significant area (>1250 mm$^2$), were used as samples.

Immersion tests using HCl 15% were accomplished. Uncoated and coated samples were exposed to 15% HCl at room temperature by using following test parameters:

Temperature: Room; Non deaerated solution

Chloride content: HCl 15%; equivalent to 150 g/litre

Duration: up to 30 days

The corrosion resistance of following samples was examined:

1. Reference—Example 1: Uncoated coupon made of Inconel 718 were lapped and tested 2. Comparative—Example 2: Inconel 718 coupon lapped and coated afterwards with a WC coating layer with thickness of about 100 micrometers by using HVOF techniques and afterwards one more time lapped.

3. Comparative—Example 3: Inconel 718 coupon lapped and coated afterwards with a WC coating layer, additionally coated with a DLC layer deposited as top layer.

4. Comparative—Example 4: Inconel 718 coupon lapped and coated afterwards with a WC coating layer having layer thickness of 3.5 micrometers, deposited by using PVD techniques, and additionally coated with a DLC layer having layer thickness of 1 micrometer, deposited as outermost layer by using PA-CVD techniques.

5. Inventive—Examples 5.1 to 5.4: Inconel 718 coupon lapped and coated afterwards with a WC coating layer having layer thickness of 11 micrometers, deposited by using PVD techniques, and additionally coated with a DLC layer deposited as outermost layer by using PA-CVD techniques. For the Example 5.1 the DLC layer was deposited having layer thickness of 1 micrometer, for the Examples 5.2 to 5.4 the DLC layer was deposited having layer thickness of 2 micrometers. The coating design in Example 5.3 differs from it in Example 5.2 in that the coating design in Example 5.3 includes additionally a metallic Cr layer deposited as adhesion layer between the lapped Inconel coupon surface and the 11 μm thick WC layer, the Cr adhesion layer having layer thickness between 200 and 300 nm. Both coating designs in Examples 5.3 and 5.4 are the same. The only difference between the Examples 5.3 and 5.4 is due to a change in one coating parameter during the deposition of the WC layer.

6. Inventive—Example 6: Inconel 718 coupon lapped and coated afterwards with a WC coating layer having layer thickness of 25 micrometers, deposited by using PVD techniques, and additionally coated with a DLC layer having layer thickness of 4 micrometers, deposited as outermost layer by using PA-CVD techniques. For the Example 6 the no additional metallic Cr layer was included as adhesion layer. The same deposition processes used for depositing the WC coating layer and the DLC coating layer in Example 5.4 were used. The only difference was that the deposition time was increased respectively for attaining thicker coating layers as described above.

Figure 4:
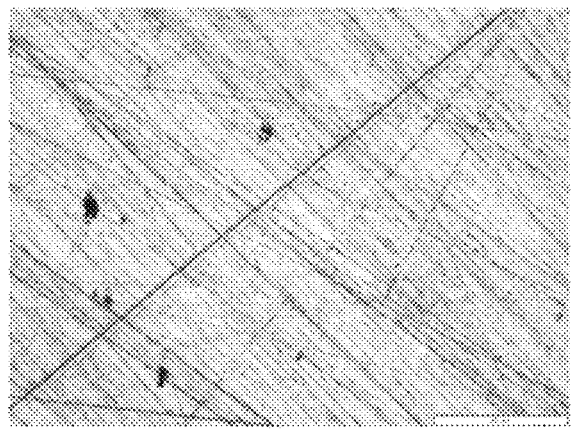
FIG. 4, including
Figure 4:
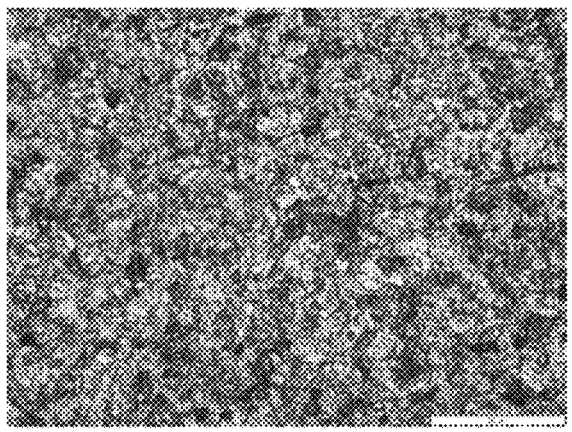
Figure 4:
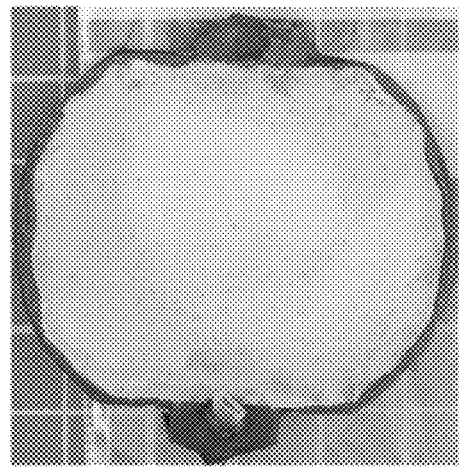
Figure 4:
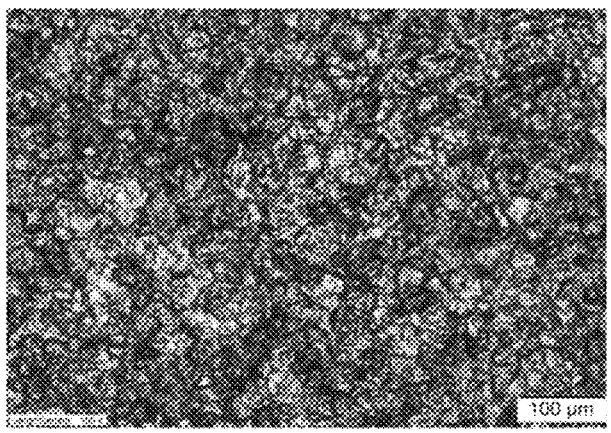
Figure 4:
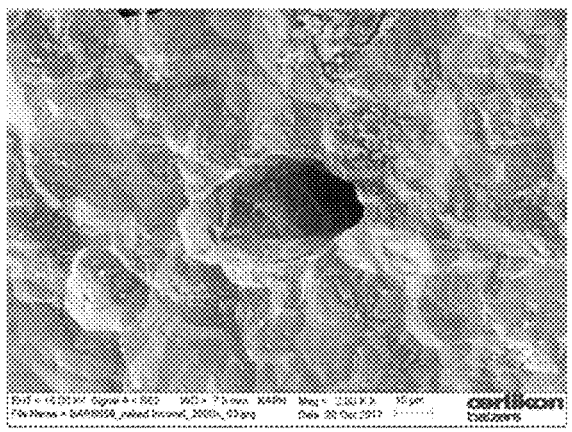

FIG. 4 shows the uncoated Inconel 718 coupon before steeping in the HCl solution and after being subjected to corrosion test for 7 days and 30 days, respectively—according to Example 1 (reference). Before steeping the Inconel 718 coupon in the HCl 15% solution, the surface of the Inconel 718 coupon was lapped and looked as shown in FIG. 4a. After 7 days dipped in HCl solution, the Inconel 718 surface exhibited clear signs of corrosion attacks as it can be observed in the light-optical microscopic picture shown in FIG. 4b. The pictures 4c, 4d and 4e show the Inconel 718 surface after 30 days in HCl. In the picture shown in FIG. 4c, it seems the uncoated Inconel 718 surface is free of corrosion because no corrosion attacks can be observed in this picture. However, the light-optical microscopic picture shown in FIG. 4d shows clear corrosion attacks. The surface morphology resulted after 30 days dipped in the HCl solution as well as a hole caused by the corrosion attacks can be clearly observed in the SEM picture shown in FIG. 4e.

Figure 5:
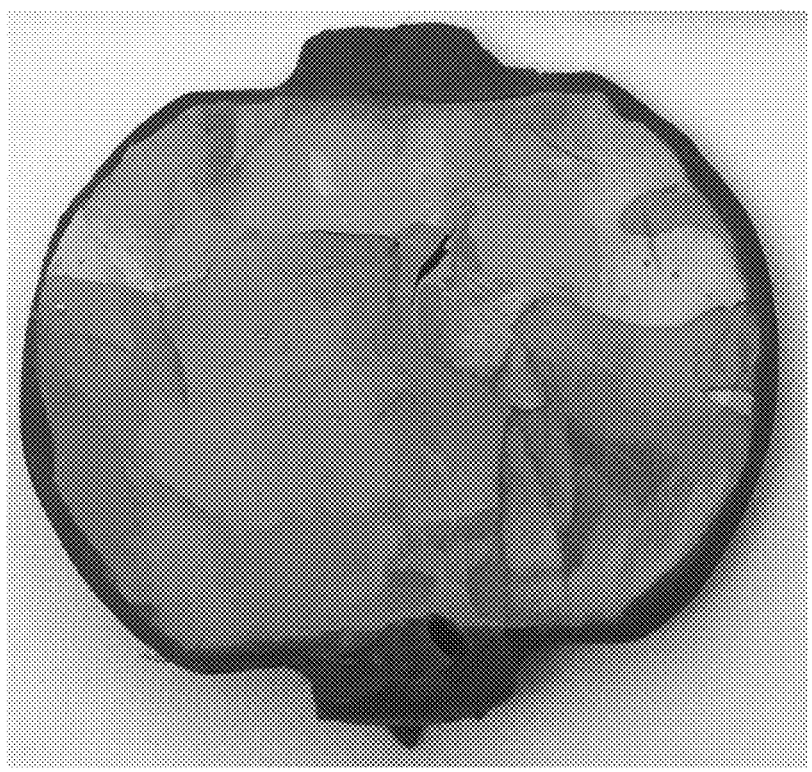
FIG. 5 shows a picture of a comparative sample according to Example 2.

FIG. 5 shows a picture of the Inconel 718 coupon coated by using HVFO techniques according to Example 2 (comparative), wherein a WC coating layer having thickness of 100 micrometers was sprayed on a surface of the Inconel 718 coupon and after that was subjected to corrosion test. The picture was recorded after the coated sample was dipped during 30 days in the hydrochloric acid solution (HCl 15%). One can observe that the WC coating layer sprayed by HVOF lifted from the substrate. It is a clear indication that such a coating in a real application in a gate valve would delaminate from the substrate and would not be able to continue performing its function.

Figure 6:
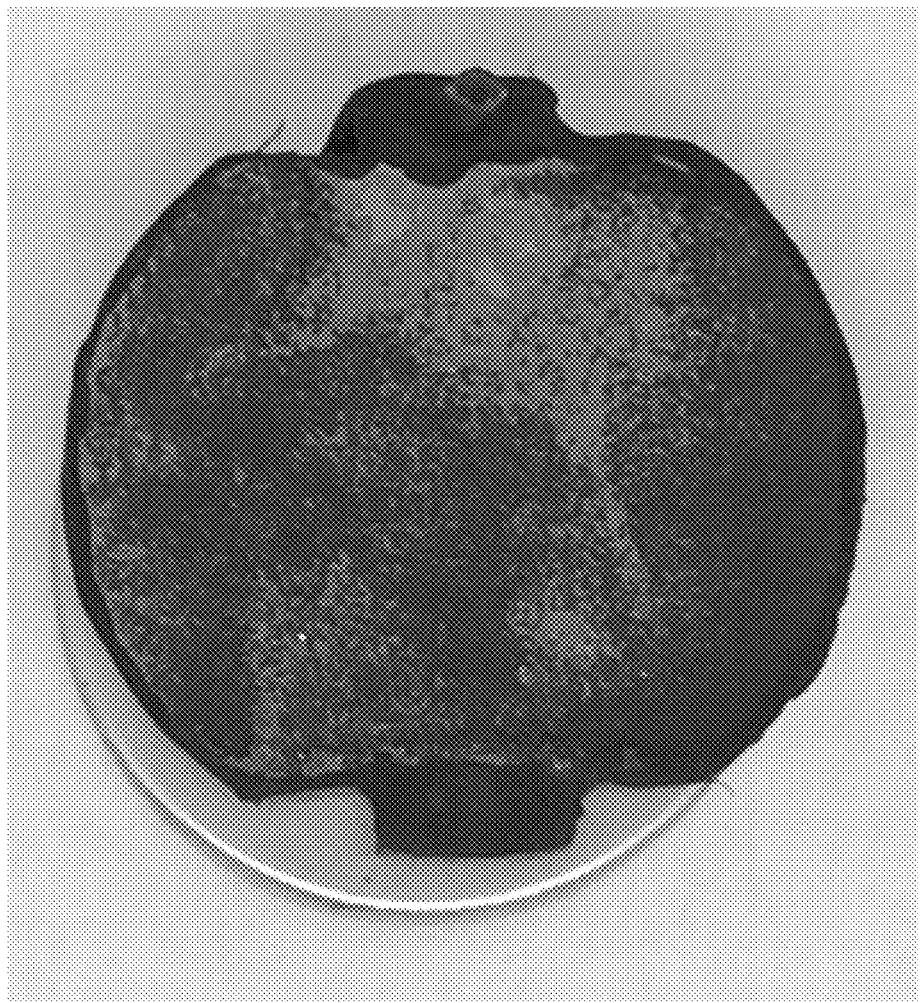
FIG. 6 shows a picture of another comparative sample according to Example 3.

FIG. 6 shows a picture of the coating design examined according to Example 3 (comparative) after 7 days in HCl 15%. In this case, the Inconel 718 coupon was lapped and afterwards coated with a 100 μm thick WC coating layer in the same manner that in Example 2, but for Example 3, the WC sprayed layer was additionally deposited with a DLC coating layer as outermost layer by using PA-CVD techniques. The complete coating design examined in Example 3 comprises furthermore a first metallic chromium interlayer (1$^{st}$ Cr layer) deposited on the WC sprayed layer, a chromium nitride layer (CrN layer) deposited on the 1$^{st}$ Cr layer, a second metallic chromium interlayer (2$^{nd}$ Cr layer) deposited on the CrN layer, a chromium carbide (CrC layer) gradient layer. Both the 1$^{st}$ Cr- and 2$^{nd}$ thin Cr layers (each one with thickness of about 200 nm) were deposited by sputtering of Cr-targets in a vacuum atmosphere comprising only argon as working gas and not any further gas as reactive gas. The CrN layer was deposited by sputtering of Cr-targets in a vacuum atmosphere comprising only argon as working gas and only nitrogen as reactive gas. The 2$^{nd}$ Cr layer was followed by the CrC layer that was deposited by a combined sputtering and PA-CVD process, in which Cr was sputtered from the Cr-targets in a vacuum atmosphere comprising only argon as working gas and only acetylene ($C_2H_2$) as reactive gas. The sputtering power at the targets was reduced and the acetylene flow was increased progressively for the formation of the CrC gradient layer. Finally, the operation of the Cr targets was completely interrupted and the DLC layer was deposited as outermost layer by using PA-CVD techniques. The DLC top layer already after 7 days was attacked by the acid in such a manner that the originally available low friction properties of the DLC layer cannot be more offered. The DLC coating was at least partially removed as it can be observed in the picture shown in FIG. 6.

Figure 7:
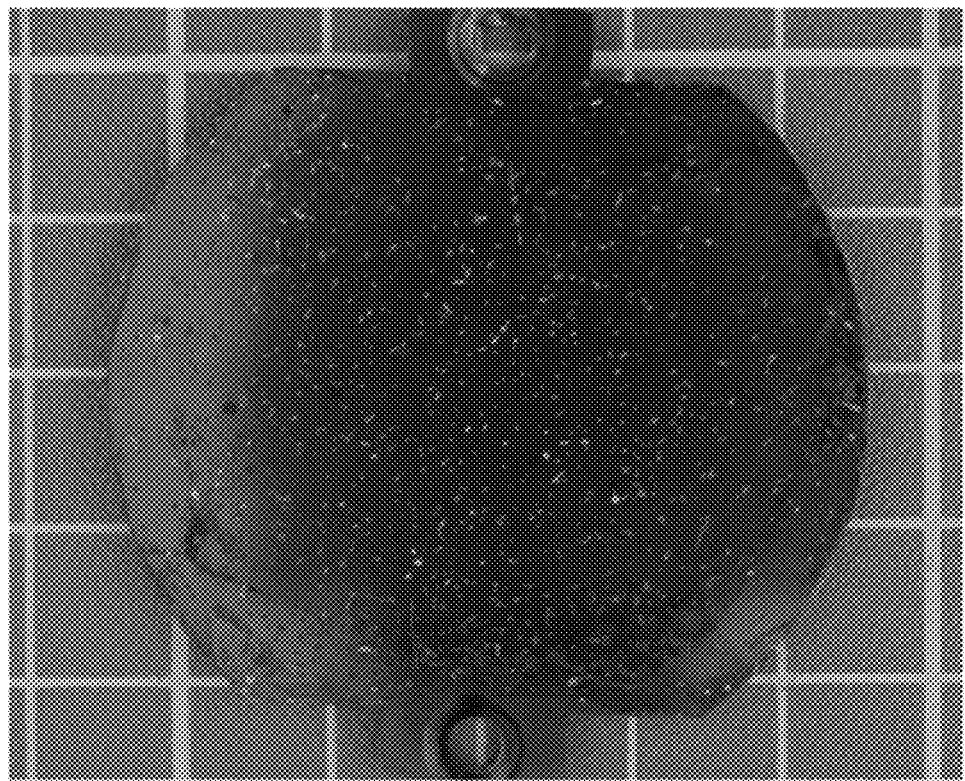
FIG. 7 shows a picture of yet another comparative sample according to Example 4.

FIG. 7 shows a picture of the coating design examined according to Example 4 (comparative) after 30 days in HCl 15%. In this case, the Inconel 718 coupon was lapped and afterwards coated with a 3.5 μm thick WC coating layer deposited by sputtering of WC-targets in a vacuum atmosphere comprising only argon as working gas and not any further gas as reactive gas, the WC layer was additionally coated with a 1 μm thick DLC coating layer deposited as outermost layer by using PA-CVD techniques. After 30 days in HCl this coating shows several attacks on the substrate (bright spots) as it can be observed in FIG. 6.

For the deposition of the WC coating layer for the examination of the coating designs according to Examples 5.1 to 5.3 the same deposition process as in Example 4 was used. Only the deposition time was increased for producing WC coating layers with layer thickness of 11 μm instead of 3.5 μm. Only for the deposition of the WC coating layer for the examination of the coating design according to Examples 5.4 one change in the deposition process used for producing WC coating layers was made. A mixture of argon and acetylene ($C_2H_2$) was used instead as only argon. In this case, the Inconel 718 coupon was lapped and afterwards coated with a ca. 300 nm thick Cr adhesion layer, directly on the Cr adhesion layer a 11 μm thick WC coating layer was deposited by sputtering of WC-targets in a vacuum atmosphere comprising only argon as working gas and only acetylene ($C_2H_2$) as reactive gas. Preferably the gas pressure in the coating chamber during deposition with only Argon was maintained at ca. 4×10$^3$ mbar, while for deposition using additionally acetylene gas flow of ca. 50 sccm, a gas pressure in the coating chamber of ca. 4.5×10$^3$ mbar was maintained. The WC layer was additionally coated with a 2 μm thick DLC coating layer deposited as outermost layer by using PA-CVD techniques.

Figure 8:
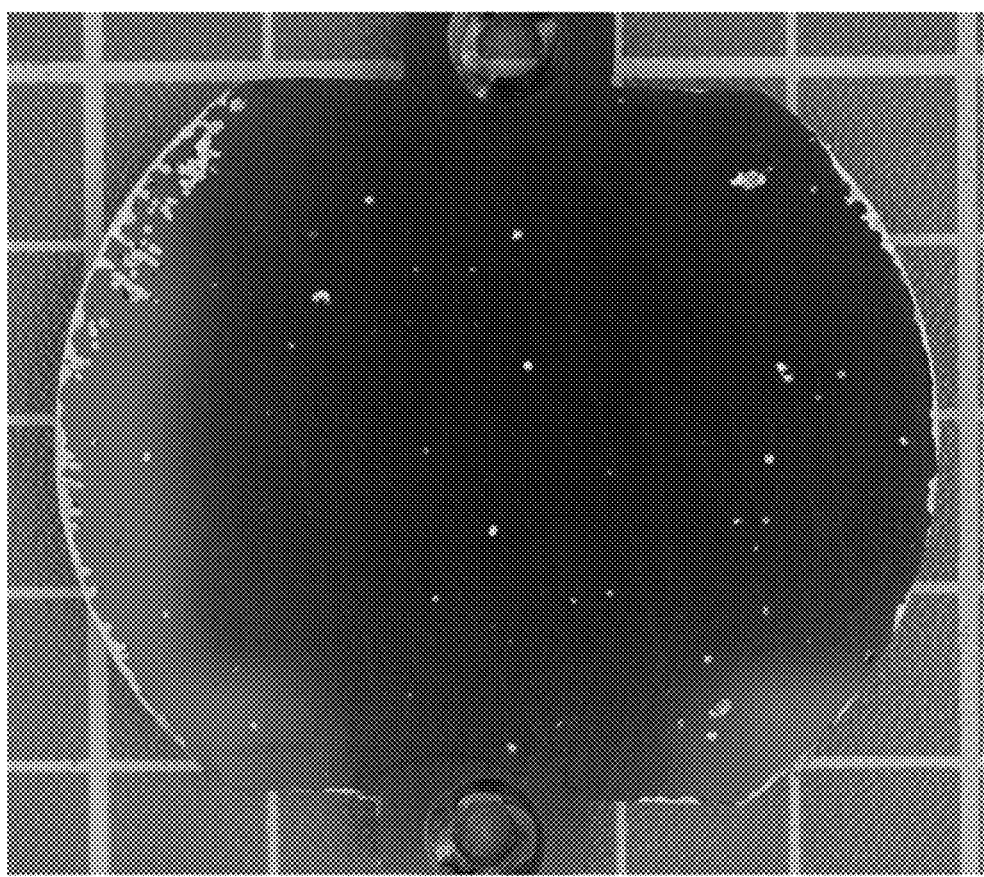
FIG. 8 shows a picture of an inventive sample according to Example 5.4.

FIG. 8 shows a picture of the coating design examined according to Example 5.4 (inventive) after 30 days in HCl 15%. After 30 days in HCl this coating design shows some spots, where the substrate is attacked, and the coating is gone, but the amount is much smaller than in comparison with Example 4.

Figure 9:
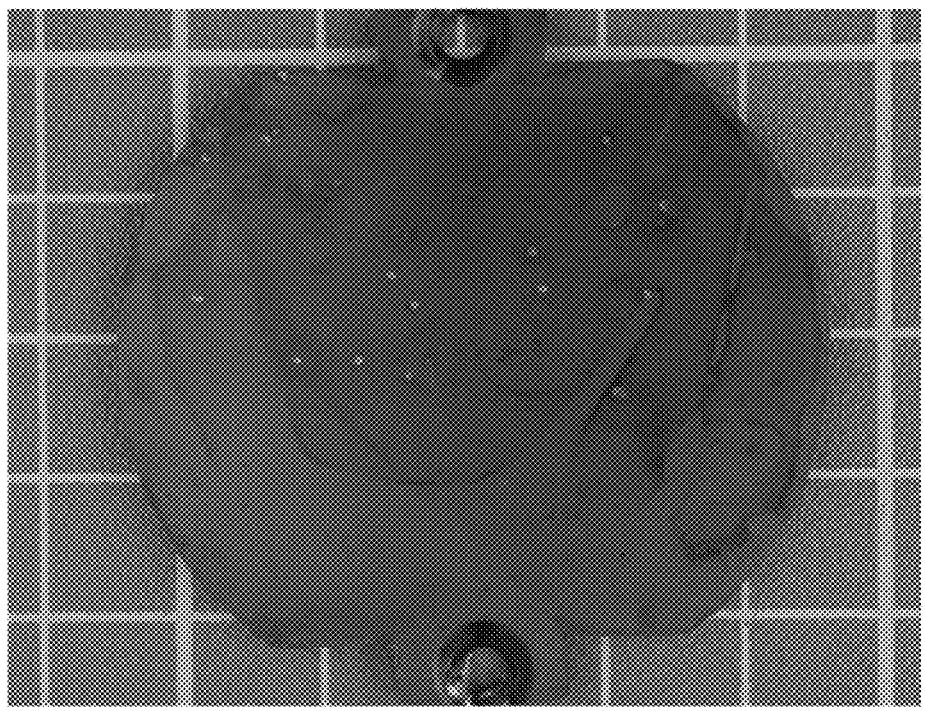
FIG. 9 shows a picture of another inventive sample according to Example 6.

FIG. 9 shows a picture of the Inconel coupon lapped and coated according to Example 6 after corrosion test, i.e. after 30 days in HCl 15%. The coating consisting of an under-layer of WC having 25 μm, deposited by sputtering of WC-targets in an atmosphere containing argon and acetylene as described above for Example 5.4, and an upper-layer deposited as outermost layer made of DLC and having layer thickness of 4 μm for providing the coating system with low friction properties at the top surface. After 30 days in HCl the number of defects is very low.

In order to ensure also good results in real application gates and seals were coated and subjected to sand slurry tests in accordance with ISO 10414-1.

For the conduction of the sand slurry tests gates and seals were coated with:

An inventive coating design according to Example 6, in which the WC under-layer exhibited a layer thickness of 25 micrometers, A comparative coating design differing from the directly above described comparative design in that the layer thickness of the WC under-layer was of 10 micrometers.

During sand slurry tests the comparative coatings having under-layer thickness of 10 micrometers suffered damages and did not pass the test.

Only the inventive coatings were able to pass the test.

Specially the above mentioned inventive coating shows no damages and passed the sand slurry test, which is a fundamental requisite for success in real applications.

The invention claimed is:
1. A valve component comprising:
a substrate with at least one sliding surface, the sliding surface being designed to be subjected to sliding against another surface during operation of the valve, wherein at least a portion of the sliding surface is coated with a coating comprising an under-layer comprising tungsten and an upper-layer deposited atop the under-layer, said upper-layer comprising diamond-like-carbon, wherein
the under-layer comprises carbon and has a layer thickness between 20 and 30 micrometers, and
the upper-layer has a lower coefficient of friction than the under-layer and has a layer thickness of at least 1.5 micrometers.
2. The valve component according to claim 1, wherein the under-layer has a layer thickness of at least 12 micrometers.
3. The valve component according to claim 1, wherein the under-layer comprises WC deposited by PVD sputtering of WC-targets in a vacuum chamber comprising argon and a carbon-containing gas.
4. The valve component according to claim 3, wherein the carbon-containing gas is acetylene gas.
5. The valve component according to claim 1, wherein:
between the coating and the sliding surface a Cr layer is deposited as an adhesion layer and the under-layer comprises:

a first-under-layer comprising Cr and WC, wherein the first-under-layer is formed having a multilayer structure comprising:
a first sub-layer deposited on the Cr adhesion layer, a second sub-layer deposited on the first sub-layer and a third sub-layer deposited on the second sub-layer,
wherein, if only Cr-content and WC-content in the first-under-layer are considered, then:
the first sub-layer is a gradient layer, exhibiting decreased average concentration of Cr and increased average concentration of WC along its thickness in a direction toward an outermost layer with an initial average concentration of Cr of 100 at % and an initial average concentration of WC of 0 at. %,
the second sub-layer is a layer with a constant average concentration of Cr and WC along its thickness, and
the third sub-layer is a gradient layer, exhibiting decreased average concentration of Cr and increased average concentration of WC along its thickness in a direction toward the outermost layer with a final average concentration of Cr of 0 at % and a final average concentration of WC of 100 at. %,
a second-under-layer deposited on the first-under-layer comprising WC+C or comprising WC+C+H,
a third-under-layer deposited on the second-under-layer deposited as a gradient layer, exhibiting decreased average concentration of WC along its layer thickness with a final average concentration of WC of 0 at. %, and
an upper layer of DLC.

6. A method for producing a valve component comprising a substrate with at least one sliding surface being designed to be subjected to sliding against another surface during operation of the valve, the method comprising:
coating at least a portion of the sliding surface with a coating, wherein the coating comprises an under-layer comprising tungsten and an upper-layer comprising diamond-like-carbon; and
depositing the upper-layer atop the under-layer, wherein the under-layer comprises carbon and has a layer thickness between 20 and 30 micrometers, and wherein the upper-layer has a lower coefficient of friction than the under-layer and has a layer thickness of at least 1.5 micrometers.

7. The method according to claim 6, comprising using a PVD sputtering process for depositing the under-layer and using a PA-CVD or PVD sputtering or ARC evaporation or HIPIMS for depositing the upper-layer.

8. The method according to claim 6, comprising depositing a Cr layer between the coating and the sliding surface as an adhesion layer, using a PVD sputtering process.

9. The method according to claim 8,
wherein the under-layer comprises:

a first-under-layer comprising Cr and WC, wherein the first-under-layer is formed having a multilayer structure comprising:
a first sub-layer deposited on the Cr adhesion layer, a second sub-layer deposited on the first sub-layer and a third sub-layer deposited on the second sub-layer,
wherein, if only Cr-content and WC-content in the first-under-layer are considered, then:
the first sub-layer is a gradient layer, exhibiting decreased average concentration of Cr and increased average concentration of WC along its thickness in a direction toward an outermost layer with an initial average concentration of Cr of 100 at % and an initial average concentration of WC of 0 at. %
the second sub-layer is a layer with a constant average concentration of Cr and WC along its thickness, and
the third sub-layer is a gradient layer, exhibiting decreased average concentration of Cr and increased average concentration of WC along its thickness in a direction to toward the outermost layer with a final average concentration of Cr of 0 at % and a final average concentration of WC of 100 at. %,
a second-under-layer deposited on the first-under-layer comprising WC+C or comprising WC+C+H,
a third-under-layer deposited on the second-under-layer deposited as a gradient layer, exhibiting decreased average concentration of WC along its layer thickness with a final average concentration of WC of 0 at. %, and
an upper layer of DLC,
wherein for the deposition of the Cr layer, Cr-targets are sputtered in an argon atmosphere, following the depositing of the first sub-layer, WC-targets are sputtered by increasing sputtering power continuously, while sputtering power continuously increases, sputtering power at the Cr-targets can be maintained constant,
wherein for depositing the second sub-layer, both the sputtering power of the Cr-targets and the WC-targets is maintained constant,
wherein for depositing the third sub-layer, the sputtering power at the Cr-targets is continuously reduced until disconnection of the Cr-targets, and the sputtering power at the WC-targets is maintained constant or increased continuously,
wherein for depositing the second-under-layer, acetylene gas is introduced in a coating chamber and maintained constant,
wherein for depositing the third-under-layer, the sputtering power at the WC-targets is reduced continuously until disconnection of the WC-targets, while a flow of the acetylene gas is increased as well as bias voltage is increased until a desired condition for depositing the DLC upper-layer is attained.

* * * * *